United States Patent [19]

Friedman

[11] Patent Number: 5,107,458
[45] Date of Patent: Apr. 21, 1992

[54] BUBBLE MEMORY PERIPHERAL SYSTEM TOLERANT TO TRANSIENT IONIZING RADIATION

[75] Inventor: Arthur L. Friedman, Studio City, Calif.

[73] Assignee: Science Applications International Corporation, San Diego, Calif.

[21] Appl. No.: 294,163

[22] Filed: Jan. 6, 1989

[51] Int. Cl.⁵ ............................................. G11C 19/08
[52] U.S. Cl. .......................................... 365/6; 365/1; 371/13
[58] Field of Search ...................... 365/1, 2, 6; 371/13

[56] References Cited

U.S. PATENT DOCUMENTS

| | | | |
|---|---|---|---|
| 978,405 | 8/1876 | Petree | 324/158 T |
| 3,869,684 | 3/1975 | Zendle et al. | 317/16 |
| 3,947,727 | 3/1976 | Stewart | 317/31 |
| 3,973,224 | 8/1976 | Gaule et al. | 333/24 |
| 3,982,058 | 9/1976 | Hill | 174/2 |
| 4,017,863 | 4/1977 | Tharp et al. | 343/719 |
| 4,021,759 | 5/1977 | Campi | 333/70 R |
| 4,021,760 | 5/1977 | Campi | 333/70 R |
| 4,044,258 | 8/1977 | Frungel | 250/336 |
| 4,066,981 | 1/1978 | Levine | 331/108 B |
| 4,330,166 | 5/1982 | Cooper et al. | 339/143 R |
| 4,362,898 | 12/1982 | Zendle et al. | 174/35 R |
| 4,365,332 | 12/1982 | Rice | 365/1 |
| 4,383,225 | 5/1983 | Mayer | 333/12 |
| 4,463,309 | 7/1984 | Crochet et al. | 324/57 R |
| 4,559,579 | 12/1985 | Val | 361/220 |
| 4,586,104 | 4/1986 | Standler | 361/91 |
| 4,656,313 | 4/1987 | Moore et al. | 174/35 R |
| 4,660,014 | 4/1987 | Wenaas et al. | 336/84 C |
| 4,677,253 | 6/1987 | Blomqvist | 174/35 R |
| 4,687,622 | 8/1987 | Longden | 376/254 |
| 4,700,629 | 10/1987 | Benson et al. | 102/201 |
| 4,707,049 | 11/1987 | Gliha | 439/620 |
| 4,931,990 | 6/1990 | Perkin | 365/1 |

Primary Examiner—Joseph A. Popek
Attorney, Agent, or Firm—Fitch, Even, Tabin & Flannery

[57] ABSTRACT

A transient ionizing radiation tolerant peripheral system for a magnetic bubble memory includes a a transient ionizing radiation tolerant rotating field coil driver and a transient ionizing radiation tolerant function gate controller. Both the transient ionizing radiation tolerant rotating field coil driver and the transient ionizing radiation tolerant function gate controller have predrivers each having a bipolar switching transistor having a base, a collector and an emitter. An anti-saturation diode is connected to the collector of the bipolar switching transistor to prevent its switching speed from being reduced by being driven into saturation by excess charge carries generated by transient ionizing radiation. A photocurrent compensator is connected to the switching transistor and draws current away from its base during exposure to transient ionizing radiation. This prevents the excess charge carriers generated by the transient ionizing radiation from increasing the current flowing in the switching transistor's collector-emitter circuit. The transient ionizing radiation tolerant function gate controller having the predriver generates constant current during exposure to transient ionizing radiation and energizes the magnetic bubble memory during generate, replicate and swap operations.

20 Claims, 6 Drawing Sheets

REPLICATE PULSE

GENERATE PULSE

SWAP PULSE

ROTATING FIELD COIL CURRENTS

BUBBLE MEMORY PERIPHERAL SYSTEM TOLERANT TO TRANSIENT IONIZING RADIATION

BACKGROUND OF THE INVENTION

The invention relates generally to radiation tolerant electronic circuits and in particular to a transient ionizing radiation tolerant peripheral system for use with a magnetic bubble memory.

As semiconductor based electronic systems have become more complex and faster, they have also become more vulnerable to perturbation and upset by external phenomena including ionizing radiation. In particular, transient ionizing radiation of the type produced by fission and fusion weapons can profoundly disturb semiconductor systems, including microcomputer based systems used for command and control in national defense. A typical transient ionizing radiation event is of relatively short duration, lasting less than 50 nanoseconds; however, the effects of the radiation on semiconductors may last for several microseconds.

Transient ionizing radiation interacts with semiconductor material, in particular with doped silicon, by producing extra electron and hole pairs within the semiconductor crystal. The surplus electrons and holes cause a temporary increase in the number of charge carriers in the semiconductor. The charge carriers are those charged bodies which are free to move in response to an electric field of a few volts, a field strength typically applied to semiconductor integrated circuits. The unwanted radiation induced increase in conductivity and in current amplitudes can cause logic or memory devices to change state and can even lead to damage from transient currents which overheat and burn out portions of the integrated circuits. The increase in available charge carriers also can increase the electric field across the gate oxides of field effect transistors, leading to punch-through of the oxides or latch-up of CMOS integrated circuits due to abrupt increases in potentials within the circuits. On a temporary basis, the increase in the number of charge carriers can also cause changes in the states of semiconductor memories leading to corruption of stored data which can cause catastrophic system failure. In addition, spurious signals may be circulated throughout such a system and cause system failure.

One method for avoiding the deleterious effects of the transient ionizing radiation is to employ memories which are relatively impervious to the radiation. One such memory is a magnetic domain bubble memory or magnetic bubble memory. Magnetic bubble memories consist of a substrate having a thin, epitaxial magnetic layer formed thereon. The epitaxial magnetic layer has its crystalline structure oriented so that it may be magnetized transversely to the plane of the epitaxial layer, as opposed to parallel to the plane of the layer as for most common magnetic materials. The epitaxial magnetic layer is orthoferrite or in most cases, doped garnet. Normally, the magnetic domains in doped garnet organize themselves into serpentine or sinuous patterns. If a static magnetic bias field normal to the epitaxial film layer is applied, the serpentine patterns tend to shrink until right circular cylindrical magnetic domains are formed which are oriented parallel to the applied static bias field. These cylindrical magnetic domains are also known as magnetic bubble domains or magnetic bubbles.

The magnetic bubble memory epitaxial layer has a plurality of chevrons formed thereon. The chevrons consist of soft magnetic material and are used to propagate the magnetic bubbles in preferred directions in the epitaxial layer. The magnetic bubbles can be moved by application of an in-plane magnetic field gradient. Typically, the field is changing or rotating and is generated by currents flowing in a pair of coils, one coil producing a magnetic field having a cyclically varying magnitude and oriented in an X direction, the other coil producing a magnetic field having a cyclically varying magnitude and oriented transversely to the X direction in a Y direction. Both the X and Y directions are aligned with the plane of the epitaxial magnetic layer. Typically, the coils are each energized by a respective rectangular wave voltage. The voltages are separated from one another by 90°, thereby causing the resulting field from the coils to rotate 360° during each period of applied voltage. Each 360° rotation of the magnetic field causes each of the magnetic bubbles in the epitaxial layer to move from a selected or parked position on one chevron to an identical selected or parked position on an adjacent chevron.

The circuits which generate the rotating field currents are typically composed of semiconductor material and may fail temporarily when exposed to transient ionizing radiation. A typical failure of a rotating field coil driver causes the current in the rotating field coil to remain constant for a short period of time thereby becoming delayed or out of phase with the signals from other portions of the system. As a result, the magnetic bubbles will not have reached their proper parking positions at the end of the next timing cycle, causing the information stored in the magnetic bubble memory to be lost.

As mentioned above, the magnetic bubble memories operate by circulating magnetic bubble domains throughout an epitaxial magnetic layer or film. Binary information is stored in the magnetic epitaxial layer in the form of the presence or absence of magnetic bubbles. The magnetic bubbles are formed by nucleating a magnetic bubble or by replicating which entails cutting and transferring a magnetic bubble. A swap operation directs the newly formed magnetic bubble to a storage loop where it is circulated by the rotating magnetic field. In an output operation, data are transferred out of the storage loops by means of a replicate operation.

The replicate, generate and swap operations require relatively large amounts of current to be supplied to replicate, generate and swap gates on the epitaxial layer which produce magnetic fields in order to cut, nucleate, transfer or swap the magnetic bubble domains. In the event that a conventional bubble memory is exposed to transient ionizing radiation, the radiation can either create current surges or cause a loss of current in the semiconductor circuits which operate the function gates. This leads to the creation of spurious data which are then stored within the bubble memory.

Bubble memories also have output cycles wherein bubbles circulating in storage loops in the epitaxial layer are replicated to form bubbles in an output loop. The bubbles in the output loop are propagated by the rotating field to a magneto-resistive sensor which drives a sense amplifier to produce an output signal in response to the presence or absence of a bubble. The swapping operation also requires electrical current to be supplied to a swap gate which is a magnetic field generating device. The swap current may be disturbed by transient ionizing radiation perturbing the semiconductor circuits which generate it. As a result, data which have been correctly stored may be destroyed on output due to transient ionizing radiation influencing the swap circuits.

In order to avoid problems with transient ionizing radiation those skilled in the art previously employed a backup magnetic bubble memory as well as the on-line memory. The backup bubble memory contained all of the information stored in the on-line memory. The system was also equipped with a radiation sensor which reset the system and switched over to the backup memory when a transient ionizing radiation pulse was received. The problem with such a system is that it is relatively expensive because it employs wholly redundant bubble memories, which might be used for only a fraction of a second during the life of the system. In addition, if the prior system received a number of transient ionizing radiation pulses in rapid succession, the system would quickly run out of good copies of information even if multiple backup bubble memories were used.

It is also well known to protect circuits exposed to high potentials, such as lightning strikes, by providing current shunting paths to carry away extra current. Lightning arrestors perform this function by employing spark gap or arcing devices which become conductive at high potentials to carry potentially damaging current surges around the device to be protected and to ground.

What is needed is a system having semiconductive circuits which can tolerate levels of transient ionizing radiation that do not exceed radiation levels tolerated by central processing, logic or timing circuits.

SUMMARY OF THE INVENTION

The instant invention solves many of the problems in the prior art. It includes a transient ionizing radiation tolerant circulation coil or rotating field coil driver which may be exposed to pulses of transient ionizing radiation and despite being composed of semiconductors continues to produce an in-phase timing signal or current which is fed to the rotating field coils of the bubble memory system. In order to avoid the change in current which current control transistors would normally experience when exposed to transient ionizing radiation, photocurrent compensators or shunts are connected to the current control transistors to provide shunting paths around the transistors which are activated when the rotating field coil driver is exposed to transient ionizing radiation. In order to allow the rotating field coil driver to tolerate the typical 50 nanosecond pulse of radiation, anti-saturation devices are provided which limit the voltage difference between a base of each of the switching transistor and a collector. This also helps the switching transistors to return to their normal states rapidly after the transient ionizing radiation pulse terminates.

A function gate controller for supplying currents to a plurality of function gates formed on a substrate of magnetic bubble memory for performing input and output operations on the bubble memory is also provided which is tolerant to transient ionizing radiation. If the function gate controller is currently feeding current to one of the function gates when it is exposed to transient ionizing radiation substantially the same current continues flowing through the function gate. At the same time currents are prevented from flowing through the function gates which have not been so activated despite the fact that all of the transistors in the function gate controller are switched on by their exposure to the transient ionizing radiation.

In order to prevent unwanted activation of function gates, energy storage devices are connected to the function gates opposite a plurality of current generators. Some of the energy storage devices are capacitors which, despite having surrounding transistors switched on, hold the side of the function gate opposite the current source at a potential substantially equal to the current source while being exposed to transient ionizing radiation thereby preventing current from flowing through the gate by preventing a potential difference from being impressed thereacross. Other function gates are connected to inductors which resist rapid changes in current through the function gates by means of their inductance, thereby preventing a change in the current during exposure to a transient ionizing radiation pulse. In order to avoid changes in the amount of current produced by the current sources during exposure to a transient ionizing radiation pulse, photocurrent compensators also are provided between the bases and the emitters of the current control transistors to shunt preferentially photocurrent away from the emitter circuit of the current control transistor. In order to provide for rapid recovery of the current generators after the radiation pulse has ended, anti-saturation devices comprising diodes are also connected to the current control transistors for allowing them to recover rapidly from any lasting effects of the transient ionizing radiation.

These features allow a magnetic bubble system to continue operating reliably even during transient ionizing radiation. One of the important advantages of the function gate controller is that it can continue a function gate operation during radiation exposure while at the same time resisting the tendency of the radiation to cause current to flow the nonactive function gates.

The transient ionizing radiation tolerant function gate controller and the rotating field coil drivers each include a transient ionizing radiation tolerant predriver circuit having an input means and a bipolar switching transistor connected to the input means to be driven thereby. The transistor is connected in a Baker clamp configuration with an anti-saturation diode connected from the input means to the collector of the bipolar transistor to reduce delays associated with the charge storage when the bipolar transistor is exposed to transient ionizing radiation. In addition, a photocurrent compensating transistor and a photocurrent compensating resistor are connected from the base of the switching transistor to the emitter. The photocurrent compensation transistor when exposed to transient ionizing radiation experiences an increase in the number of charge carriers in its collector-base junction causing it to become more conductive and draining off excess charge from the base-emitter circuit of the switching transistor. This allows the switching transistor to recover rapidly from exposure to transient ionizing radiation.

Each of the transient ionizing radiation tolerant rotating field coil drivers consists of a circuit having four switches configured as the legs of an H with a rotating field coil connected as the crossbar. Two switches are connected in series and to one node of the rotating field coil. The other two switches are connected in series to an opposite node of the rotating field coil. Each of the switches includes a photocurrent compensation transistor and an anti-saturation diode to enable switching transistors in the switches to recover rapidly from exposure to transient ionizing radiation. In the event that a high intensity transient ionizing radiation pulse is received by the rotating field coil driver, all of the transistors turn on, allowing the radiation induced current to flow from a voltage supply rail to ground, but not substantially altering current flowing in the rotating field coil due to the inductance resisting a change in the current. This keeps the rotating field generated by the rotating field coils in synchronism with other portions of the timing or logic circuits.

It is a principal aspect of the present invention to provide a driver circuit for a magnetic bubble memory having an anti-saturation means for allowing switching to take place rapidly.

It is another aspect of the present invention to provide a driver circuit for a magnetic bubble memory having photocurrent compensation means which prevents extra currents from flowing through the switching transistor when it is exposed to transient ionizing radiation.

Other aspects of the present invention will become apparent to those having ordinary skill in the art from this specification and the the claims in light of the accompanying drawings.

DETAILED DESCRIPTION OF THE PREFERRED EMBODIMENTS

Figure 1:
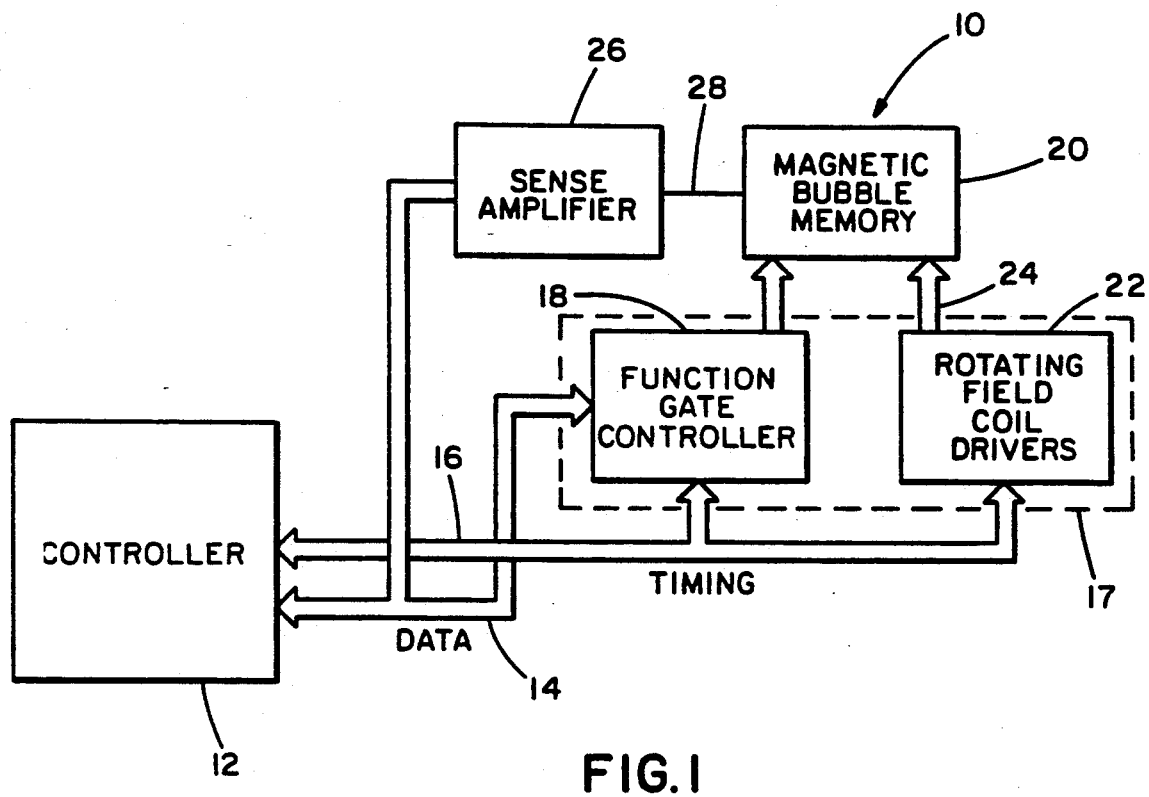
FIG. 1 is a block diagram of a magnetic bubble memory system showing in general the connections among a function gate controller, a transient ionizing radiation tolerant circulation or rotating field coil driver, a sense amplifier, and a magnetic bubble memory.
Figure 5A:
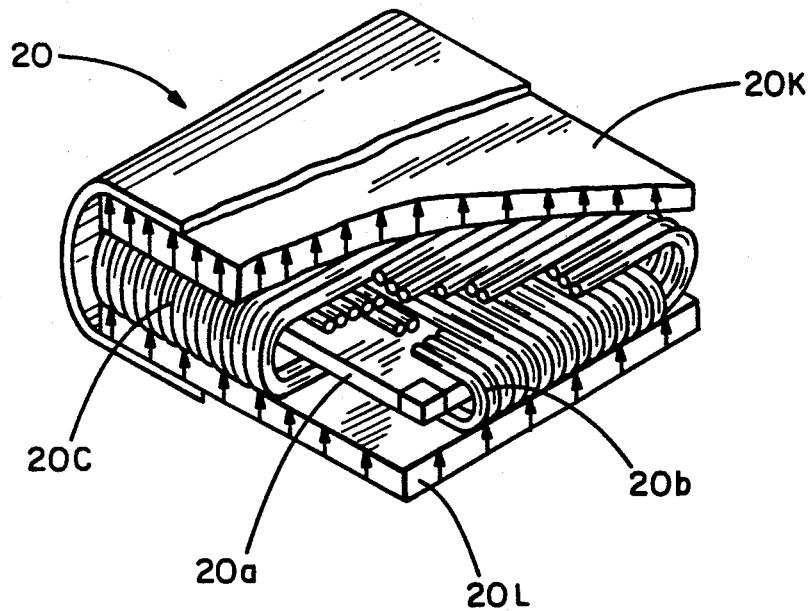
FIG. 5A is an isometric view of the magnetic bubble memory of FIG. 1 having portions broken away to show details thereof;.
Figure 5B:
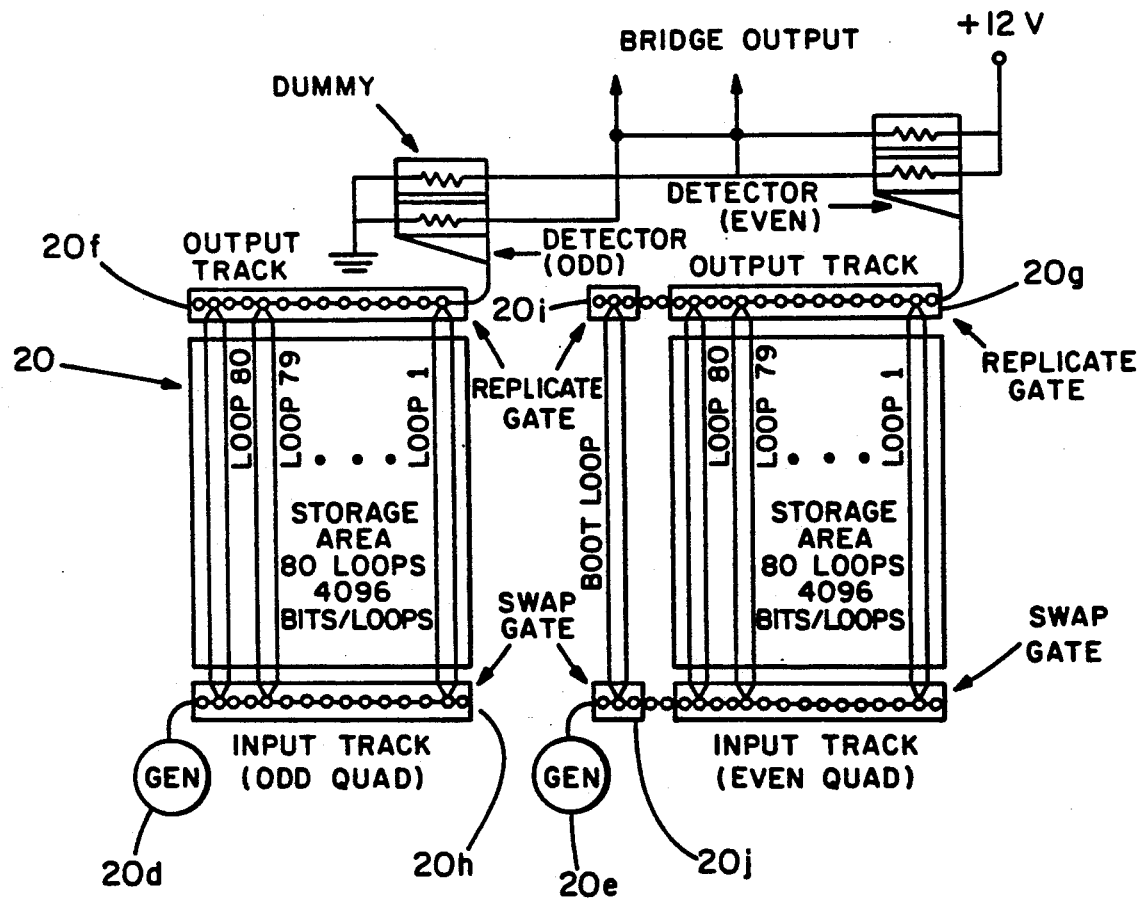
FIG. 5B is a block diagram of the magnetic bubble memory showing details of a magnetic bubble domain generate gate, replicate gates and swap gates as well as input tracks, output tracks and storage loops.

Referring now to the drawings and especially to FIG. 1, a magnetic bubble memory system 10 is shown therein embodying the present invention. The magnetic bubble memory system 10 includes a controller unit 12 having a data bus 14 to transfer data to and from other portions of the system. A timing bus 16 is also coupled to the controller unit 12 to receive timing signals therefrom for controlling other portions of the magnetic bubble memory system 10. A transient ionizing radiation tolerant peripheral system 17 comprising a transient ionizing radiation tolerant current pulse generator or function gate controller 18 and embodying the present invention is connected to the data and timing buses 14 and 16 and to a magnetic bubble memory 20. The magnetic bubble memory 20, as may best be seen in FIG. 5A, has a garnet substrate 20a with a pair of rotating field coils wound thereabout and respectively numbered 20b and 20c. For the sake of simplicity, FIG. 5A does not show the connections from the magnetic bubble memory 20 to the data and timing buses 14 and 16. The substrate 20a has a pair of magnetic bubble domain generate gates or loads, respectively numbered 20d and 20e, formed thereon as seen in FIG. 5B. The generate gates 20d and 20e are used to produce magnetic bubbles for storage during an input operation. The generated domains are fed to an input track. A pair of magnetic bubble domain replicate gates, respectively numbered 20f and 20g are formed on the substrate 20a for copying existing magnetic bubbles. A magnetic domain swap gate 20h is formed on the substrate for transfer of magnetic domains from the input track to a storage area loop on the substrate 20a. A magnetic bubble domain boot replicate gate 20i is formed on the substrate 20a for copying information from a boot replicate loop on the substrate to an output loop. A magnetic bubble domain boot swap gate 20j is formed on the substrate 20a for transferring boot-up information from the generate gate 20a to the boot storage loop.

The transient ionizing radiation tolerant peripheral system 17 also includes a pair of transient ionizing radiation tolerant rotating field or circulation coil drivers 22 connected to the magnetic bubble memory 20 via a local connection 24 and connected to the timing bus 16 to receive timing signals therefrom. The transient ionizing radiation tolerant rotating field coil drivers 22 supply currents through the local connection 24 to the rotating field coils 20b and 20c which cause a plurality of magnetic bubble domains resident in an epitaxial layer of the magnetic bubble memory substrate 20a to move from place to place in the epitaxial layer in a manner well known to those skilled in the art. The magnetic bubble memory 20 may be any conventional magnetic bubble memory of the type which may be obtained from Memtech, Magnesys, Hitachi, or other suppliers well known to those skilled in the art. An upper permanent magnet 20k and a lower permanent magnet 20l provide a bias magnetic field for maintaining the magnetic domains in the substrate 20a when the power is off.

The radiation tolerant current pulse generator 18 embodies the present invention and includes circuits which operate the magnetic domain function gates positioned on the epitaxial layer. A sense amplifier 26 is connected via a connector 28 to a magnetostrictive bubble domain detector positioned on the epitaxial layer of the bubble memory substrate 20a. The sense amplifier 26 receives electrical signals through the connector 28 from the magnetostrictive bubble domain detector due to sensed magnetic bubble domains and supplies amplified signals to the data bus 14 to which it is connected. The amplified signals are fed by the data bus to the control system 12.

As was indicated above, one of the problems associated with magnetic bubble memory systems is that the prior art driving circuitry is affected adversely by transient ionizing radiation causing spurious signals to be supplied to the magnetic bubble memory 20 which leads to a loss of integrity of the data stored therein. The instant invention embodies a number of components particularly adapted to resist the deleterious effects of the transient ionizing radiation.

Figure 2:
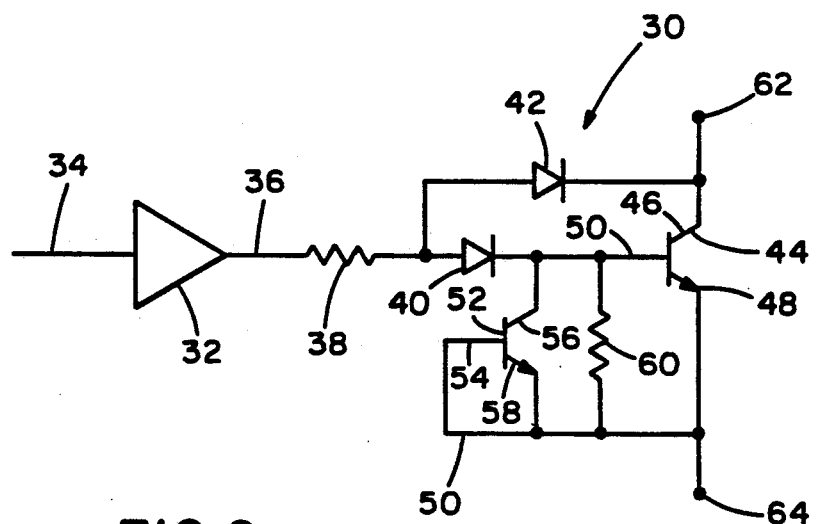
FIG. 2 is a schematic diagram of a predriver circuit embodying the present invention for use with a magnetic bubble memory.

A Baker-clamped predriver circuit 30, which is a component of the function gate controller 18 and the rotating field coil drivers 22 is shown in FIG. 2. The Baker-clamped predriver circuit 30 includes input means comprising an input buffer 32 comprised of complementary metal oxide silicon semiconductors formed on a sapphire substrate. The input buffer 32 is available commercially from Harris Semiconductor and is identified by the designator HCTS. The input buffer 32 has an input 34 and an output 36. The input 34 is connected to the data bus 14 or to the timing bus 16 to receive an appropriate signal. A resistor 38 is connected to the output 36.

Anti-saturation means comprising a first diode 40 and a second diode 42 is coupled to the resistor 38. The diode 42 is connected to an NPN bipolar current control or switching transistor 44 having a collector 46, an emitter 48 and a base 50. More particularly, the diode 42 is connected to the collector 46 to prevent the potential at the resistor 38 from rising more than 0.7 volt, the forward drop of the diode 42, above a potential at the collector 46 of the transistor 44. The diode 40 also has a forward voltage drop of 0.7 volt and is connected to a photocurrent compensation means 50 comprising an NPN bipolar compensation transistor 52 having a base 54, a collector 56, and an emitter 58. The diodes 40 and 42 comprise a Baker clamp. The transistors 44 and 52 are NPN bipolar transistors of the same type. A resistor 60 also forms part of the photocurrent compensation means and is connected in parallel with the collector-emitter circuit of the transistor 52. The resistor 60 is connected between the base 50 and the emitter 48 of the transistor 44.

In operation, when the output 36 of the buffer 32 is driven high, the output current is limited by the resistor 38 and fed through the diode 40, supplying current to the resistor 60 and to the base 50 of the transistor 44. The transistor 44 is thereby switched conducting, allowing current to flow from an output node 62 connected to the collector 46 to an output node 64 connected to the emitter 48. The output nodes 62 and 64 are typically connected between a source of positive and ground. One of the nodes 62, 64 also is connected to a circuit to be controlled.

In the event that the Baker-clamped predriver circuit 30 is exposed to transient ionizing radiation, the transient ionizing radiation typically increases the number of charge carriers in the collector-base junction of the transistor 44 normally causing it to conduct more heavily. However, simultaneously there is a similar increase in the number of charge carriers in the collector-base junction of the transistor 52, which drains current out of the base 50, causing the transistor 44 to return rapidly to its condition before being exposed to the radiation. In addition, the resistor 60 also provides a charge carrier path to remove excess charge stored in the transistor 44. A typical transient ionizing radiation pulse has a duration of less than 50 nanoseconds. The Baker-clamped predriver 30 is adapted to reduce the amplitude and duration of the transient photocurrent produced in the semiconductors by the transient ionizing radiation.

In addition, to compensate more fully for the possible deleterious effects of the radiation pulse and to return the transistor 44 to its normal operating point, the diode 42, along with the diode 40, prevents the transistor 44 from being driven into saturation. If the transistor 44 were to be driven into saturation, it would take a relatively long time for it to leave the saturated state due to storage time delays associated with bipolar transistors. Accordingly, the Baker-clamped predriver 30 resists the effects of the transient ionizing radiation through reduction of charge storage effects in the switching transistor 44 by means of the photocurrent compensation transistor 52. In addition, the diodes 40 and 42 prevent the transistor 44 from becoming saturated.

The rotating field coil drivers 22 include a driver for an X direction field coil and a driver for a Y direction field coil. Typically, as may be seen in the graph of FIG. 9, one of the rotating field coils conducts a current ramp having a triangular waveform which changes linearly from zero forward current to a maximum forward current level in one-quarter of a cycle; changes from the maximum forward level back to zero in the second quarter of the cycle; changes from zero to a maximum in the opposite direction in the third quarter of the cycle; and then changes from the reverse maximum current back to zero in the fourth quarter of the cycle. The other coil typically receives currents of the same type but phase shifted 90° so that the vector sum of the imposed H fields produced by the currents in the X and Y coils is rotated through 360° during a single cycle. The vector sum of the applied rotating magnetic field is always parallel with the epitaxial magnetic layer.

Figure 3:
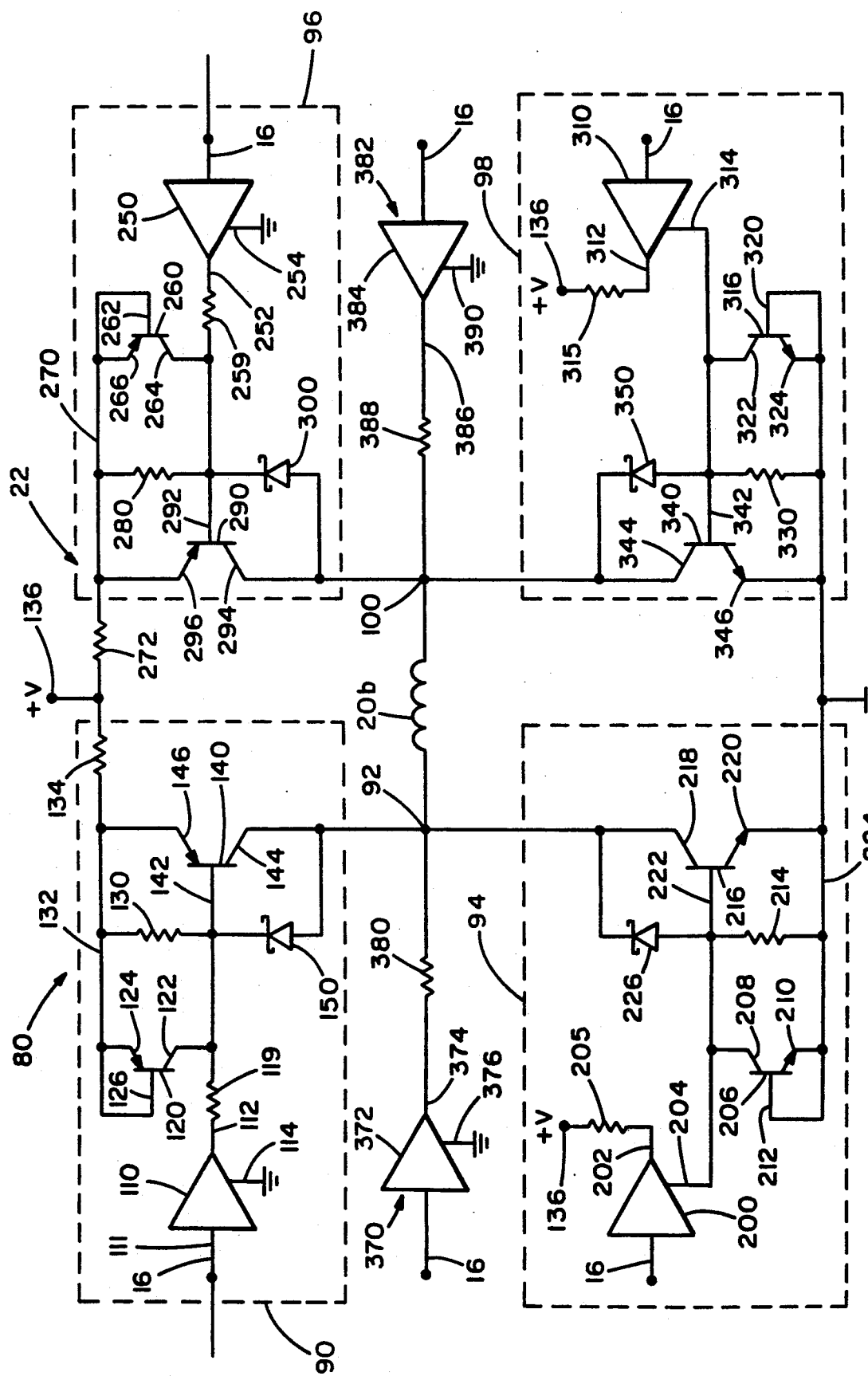
FIG. 3 is a schematic diagram of the transient ionizing radiation tolerant rotating field coil driver circuit of FIG. 1 for use with the magnetic bubble memory.

As was stated above, one of the problems associated with the prior art bubble memory coil drivers resulted from the cyclical current change in the coils being disturbed by transient ionizing radiation. The radiation caused unwanted changes in the amount of current flowing through the driver transistors from which data loss can result when the location or address of data in the storage loops, as represented by the timing signals received from the control logic, no longer corresponds to the current flowing through the field coils Referring now to FIG. 3, a transient ionizing radiation tolerant rotating field coil driver 80 comprising one of the rotating field or circulation coil drivers 22 and embodying the present invention is shown connected to the rotating field coil 20b. The rotating field coil driver 80 includes a first switch 90 connected to a node 92 of the rotating field coil 20b. A second switch 94 is connected in series with the first switch 90. A third switch 96 is connected to an opposite side of the rotating field coil 20b. A fourth switch 98 is connected in series with the third switch 96. The switches 94 and 96 are connected at a node 100 to the field coil 20b opposite the node 92.

Figure 9:
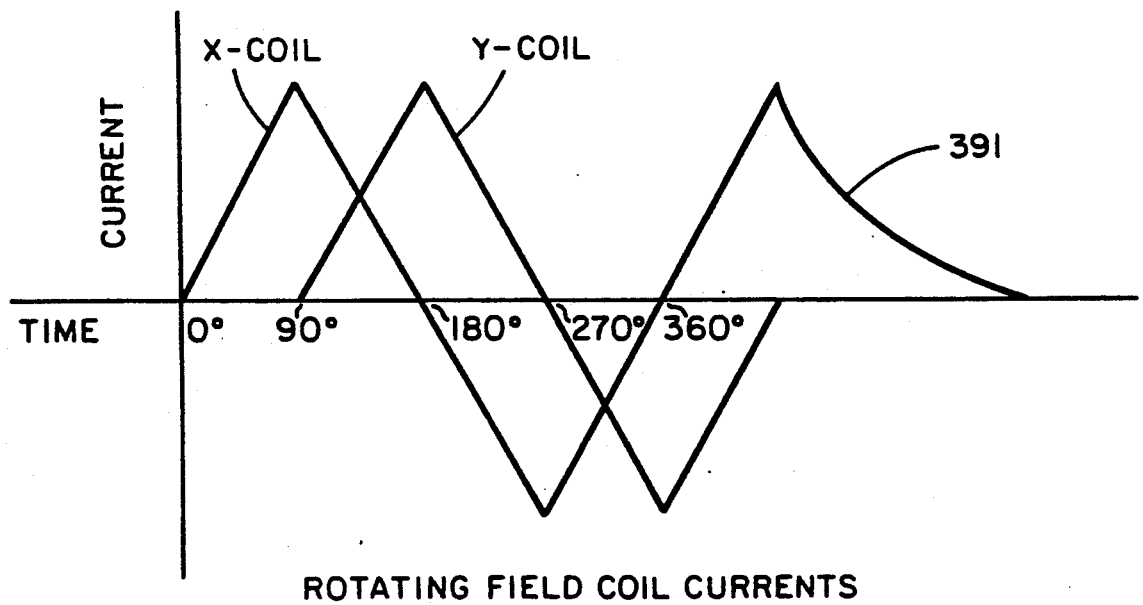
FIG. 9 is a graph of the currents flowing through the rotating field coils of the magnetic bubble memory.

In general operation as indicated in the graph of FIG. 9, during the first quarter of the rotating field coil cycle, the switches 90 and 98 are conducting, allowing current to flow through the switch 90 from the node 92 to the node 100 through the field coil 20b and then through the switch 98. Both of the switches 90 and 98 are then cutoff and current is allowed to decay through the field coil 20b during the second quarter of the cycle. The switches 94 and 96 are then switched on allowing current to flow from the switch 96 through the node 100, through the field coil 20b, through the node 92 and through the switch 94 during the third portion of the cycle. The switches 96 and 94 are then cutoff and the current is allowed to decay through the field coil 20b during the fourth quarter of the cycle.

The switch 90 is connected to a control lead 16 which is part of the timing bus 16. A Baker-clamped predriver 110 identical to the Baker-clamped predriver 30 of FIG. 2 is connected to the timing bus 16 at an input port 111 to receive a timing signal therefrom. The Baker-clamped predriver 110 also has a first output port 112 and a grounded output port 114 similar to the ports 62 and 64, respectively. A resistor 119 is connected to the first output port 112. A PNP bipolar photocurrent compensation transistor 120 having a collector 122, an emitter 124, and a base 126 has its base 126 connected to the emitter 124. The collector 122 is connected to the resistor 119. A compensation resistor 130 is connected in parallel with the collector-emitter circuit of the bipolar transistor 120. The junction of the emitter 124 and the base 126 is connected to a lead 132 which is connected through a resistor 134 to a voltage source 136, in this embodiment having a positive potential of 12 to 24 volts. The resistor 134 limits the current through the field coil 20b and in combination with the field coil 20b provides a relatively long time constant L-R circuit. A bipolar PNP transistor 140 of the same type as the transistor 120, has a base 142, a collector 144, and an emitter 146 and is connected at its emitter 146 to the lead 132 and the resistor 134. A Schottky diode 150 is connected between the collector 144 and the base 142. The Schottky diode 150 has a forward voltage drop of about 0.3 volts and prevents the PNP bipolar transistor 140 from being driven into saturation. In the event that the switch 90 is exposed to transient ionizing radiation, the photocurrent compensation transistor 120 has additional charge carriers generated by the transient ionizing radiation in its collector-base junction causing the transistor 120, which is normally off, to become conducting thereby shunting current, to the extent that extra current is produced by the transient ionizing radiation, away from the base 142 of the transistor 140 in order to restore the transistor 140 rapidly to its pre-irradiated state.

The second switch 94 is substantially similar to the first switch 90 with the exception that it employs NPN bipolar transistors. A Baker-clamped predriver 200 is connected to the timing bus 16 to receive timing signals therefrom. The Baker-clamped predriver 200 includes a first output port 202 and a second output port 204. The first output port 202 has a resistor 205 connected to it. The resistor 205 is connected to a positive voltage supply which in this embodiment is the node 136. The second output port 204 has a photocurrent compensation transistor, in this case an NPN bipolar transistor 206 connected to it. The bipolar transistor 206 has a collector 208, an emitter 210, and a base 212. The base 212 and the emitter 210 are connected together to hold the transistor 206 normally nonconducting. The collector 208 is connected to the second output port 204. A resistor 214 is connected between the collector 208 and the emitter 210. An NPN bipolar transistor 216 having a collector 218, an emitter 220, and a base 222 is connected at its base 222 to the resistor 214. The emitter 220 is connected to a grounded lead 224 which is also connected to the resistor 214, the emitter 210, and the base 212. A Schottky diode 226 having a forward drop of 0.3 volts is connected from the base 222 to the collector 218. The Schottky diode 226 comprises an anti-saturation means which prevents the potential at the base 222 from being more than 0.3 volts higher than the potential at the collector 218. The photocurrent compensation transistor 206 provides a charge drainage pathway from the base 222 of the transistor 216 in the event that both of the transistors 206 and 216 are exposed to transient ionizing radiation, thereby restoring the transistor 216 rapidly to its pre-irradiated state.

The third switch 96 is identical to the first switch 90 and is similarly connected to the coil 20b opposite the node 92 at the node 100. The third switch 96 includes a Baker-clamped predriver 250 having a first output port 252 and a grounded output port 254. Its input is connected to the timing bus 16 to receive timing signals therefrom. A resistor 259 is connected to the output port 252. A PNP bipolar photocurrent compensation transistor 260 having a base 262, a collector 264, and an emitter 266 is connected at the collector 264 to the resistor 259. The base 262 and the emitter 266 are connected together to a lead 270 coupled through a resistor 272 to the potential source 136. The transistor 260 is normally biased off. The switch 96 also includes a compensation resistor 280 connected between the collector 264 and the emitter 266. A PNP bipolar transistor 290 having a base 292, a collector 294, and an emitter 296, is connected at the emitter 296 to the resistor 272 and the lead 270. The resistor 272, like the resistor 134, comprises a resistive impedance which provides a relatively long time constant circuit in combination with the rotating field coil 20b. The collector 294 of the transistor 290 is connected to the node 100. An anti-saturation means comprising a Schottky diode 300 is connected from the collector 294 to the base 292 to prevent the potential at the base 292 from swinging more than 0.3 volts below the potential at the collector 294 and thereby preventing the transistor 290 from being driven into saturation. In the event that the third switch 96 is exposed to transient ionizing radiation, which would cause an increase in the number of charge carriers in the collector-base junction of the transistor 290, the transistor 260 then would likewise experience an increase in the number of charge carriers in its collector-base junction causing it to become conductive and draining current away from the base 292 of the transistor 290, thereby causing the transistor 290 to recover rapidly to its pre-irradiated state.

The fourth switch 98 is substantially identical to the second switch 94 in that it comprises a Baker-clamped predriver 310 connected to the timing bus 16 and having a first output port 312 and a second output port 314. A resistor 315 is connected to the output port 312. The resistor 315 is in turn connected to the supply node 136. A photocurrent compensation transistor 316 having a base 320, a collector 322, and an emitter 324 has its base 320 and emitter 324 connected together to clamp the transistor 316 normally into a nonconducting state. The collector 322 is connected to the output port 314. A resistor 330 is connected in parallel with the collector-base circuit of the transistor 316. An NPN bipolar transistor 340 having a base 342, a collector 344, and an emitter 346 has its base 342 connected to the resistor 330. A Schottky diode 350 having a forward drop of 0.3 volts is connected from the base 342 to the collector 344 to prevent the base 342 from having a potential more than 0.3 volts higher than the collector 344, thereby preventing the transistor 340 from being driven into saturation. The emitter 346 is connected to the grounded lead 224. The collector 344 is connected to the node 100. In the event that the fourth switch 96 is exposed to transient ionizing radiation which would cause the collector-base junction of the transistor 340 to experience an increase in the number of charge carriers, the collector-base junction of the transistor 316 also would have an increase in the number of charge carriers causing it to become conducting and thereby draining current away from the base 342 and rapidly restoring the transistor 340 to its pre-irradiated state.

A rotating field current decay path is provided by a decay circuit or damping shunt 370 comprising a Baker-clamped predriver 372 connected to the timing bus 16 and having a first output port 374 and a grounded output port 376. The first output port 374 has a resistor 380 connected to it. The resistor 380 is connected to the node 92. A second damping shunt 382 comprising a Baker-clamped predriver 384 having its input connected to the timing bus 16, has a first output port 386 connected through a resistor 388 to the node 100. The predriver 384 also has a second output port 390 which is grounded.

When it is desired to allow the current in the rotating field coil 20b to decay as shown at a leg 391 of the graph of FIG. 9, for instance when the rotating field is halted and the rotating field coil 20b is not to be producing a field, the switches 90, 94, 96 and 98 are cutoff by timing signals from the controller 12. The predriver 384 is turned on, grounding the node 100 through the resistor 388, the port 386 and the grounded port 390. The switch or predriver 372 also is activated causing the potential at the resistor 380 to be pulled to ground, effectively creating an overdamped L-R circuit from the rotating field coil 20b and the resistors 380 and 388 which allows the current through the rotating field coil 20b to decay to zero rapidly and without ringing.

In the event that the transient ionizing tolerant rotating field coil driver 22 is exposed to the transient ionizing radiation, it is an important aspect of the driver 22 that the current flowing through the rotating field coil 20b not be substantially perturbed from its normal wave form. As a result, if it is assumed that switches 90 and 98 are conducting, any increase in current through the transistors 140 and 340 due to unwanted production of charge carriers by the transient ionizing radiation will be compensated for by a reduction in base drive current by the photocurrent compensation transistors 120 and 316, respectively. In order to prevent the switching transistors 140 and 340 from being driven on for too long an interval, which might occur if they became saturated, the Schottky diodes 150 and 350 clamp the collectors and bases of the transistors 140 and 340 to prevent them from entering the saturation region of operation. The same, of course, is true for the switches 94 and 96.

Thus, as may best be seen in FIG. 9, during the first quarter of the cycle the Baker-clamped predriver 110 is switched on by the timing signal from the controller 12, pulling the base 142 low and allowing current to flow through the transistor 140. The input to the Baker-clamped predriver 200 is pulled low to keep the base 222 of the transistor 216 low and keep the switching transistor 216 switched off. The input to the Baker-clamped predriver 250 is driven low, cutting off the switching transistor 290. The input to the Baker-clamped predriver 310 is pulled high allowing current to flow into the base 342 switching the transistor 340 on. With switching transistors 140 and 340 on, current flows from left to right through the rotating field coil 20b.

During the second quarter of the cycle the transistors 140, 216, 290 and 340 are cut off and the current flowing in the rotating field coil 20b continues flowing from the node 92 to the node 100. The current flows from the ground lead 224, through the base 212 and the collector 206, through the Schottky diode 226 and into the node 92. After traversing the rotating field coil 20b the current flows through the Schottky diode 300, through the collector 264 and the base 262 into the lead 270, through the resistor 272 and into the supply node 136. The current flows through the Schottky diodes preferentially due to the fact that they have the smallest voltage drops across them, 0.3 volts. It may be appreciated that during the second quarter of the rotating field cycle energy is returned from the rotating field coil 20b to the power supply.

During the third quarter of the cycle, the timing signal input to the predriver 110 is low, cutting off the switching transistor 140. The timing signal input to the predriver 200 is high, turning on the switching transistor 216. The timing signal input to the predriver 250 is high, turning on the switching transistor 290; and the timing signal input to the predriver 310 is low, holding the switching transistor 340 cutoff. Current then flows through the resistor 272, the switching transistor 290, the node 100, the rotating field coil 20b, the node 92, the switching transistor 216 and the grounded lead 224.

During the fourth quarter of the rotating field cycle the transistors 140, 216, 290 and 340 again are cut off and the current continues to flow through the rotating field coil 20b from the node 100 to the node 92. Specifically, the current flows from the ground lead 224 through base 320 and the collector 322, through the Schottky diode 350 and into the node 100. After flowing through the rotating field coil 20b the current enters the Schottky diode 150, flows through the collector 122, and the base 126 into the lead 132, through the resistor 134 and into the power supply node 136.

In worst case situations, if the circuit 22 is exposed to a transient ionizing radiation pulse for which it cannot compensate, the switching transistors 140, 290, 216 and 340 would all switch on, connecting the positive potential to ground through the resistors 134 and 272. The resistors 134 and 272 would protect the transistors 140, 216, 290 and 340 from burnout and the current would continue flowing momentarily in the rotating field coil 20b, undisturbed by the excess current through the left and right legs of the circuit 22, without substantially perturbing the rotating field intensity at the magnetic bubble memory epitaxial layer.

It may be appreciated that the switches 96 and 98 also comprise current paths, and passive circuits could be substituted therefor, such as resistors and capacitors. The switches could be eliminated by grounding the node 100 and applying a potential of minus the supply voltage to the node 224. Thus, only two switches are needed to practice the present invention. The switch 90, in such an alternative embodiment would be turned on, while the switch 94 is turned off, conducting current through the rotating rotating field coil 20b, through a passive device or a network connected to the node 100 and out the lead 224. Likewise, if the switch 90 is cutoff and the switch 94 is turned on, current would flow through a passive network connected from the lead 270, to the node 100, through the rotating field coil 20b, out the node 92 and through the switch 216.

Figure 4:
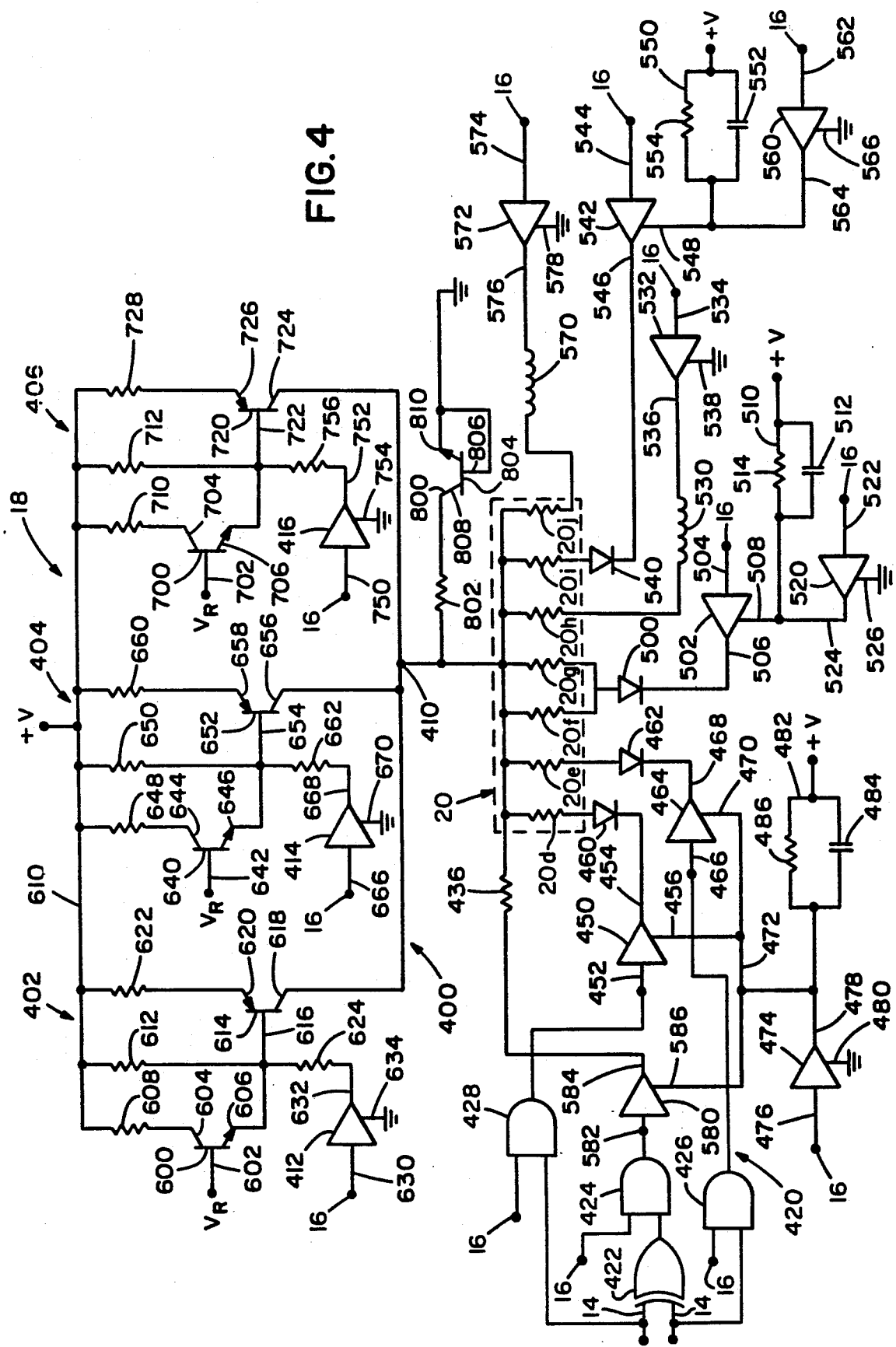
FIG. 4 is a schematic diagram of the transient ionizing radiation tolerant function gate controller of FIG. 1, employing current steering and showing details of the connection of the controller to a plurality of magnetic bubble memory function gates for generating, replicating and swapping magnetic bubble domains in the magnetic bubble memory.

As shown in FIG. 4, the magnetic domain controlling input/output function gate controller 18 comprises a plurality of constant current generators 400 including a first current generator 402, a second current generator 404, and a third current generator 406, all connected to a current node 410. Each of the constant current generators 402, 404, and 406 has a respective current source enabling switch 412, 414, and 416.

A data select unit 420 includes an exclusive OR gate 422 connected to a pair of leads from the data bus 14 to receive data bits therefrom. The exclusive OR gate 422 is connected to an AND gate 424. The AND gate 424 also receives an input from the timing bus 16. An AND gate 426 is connected to one of the leads connected to the exclusive OR gate 422 and to the timing bus 16. For controlling enabling of the function gate 20e, AND gate 428 is connected to the timing bus 16 and to the other lead 14 connected to the exclusive OR gate for controlling activation of the function gate 20d. In the event that both of the generate gates 20d and 20e are to produce magnetic bubbles for a bit pattern 11, the exclusive OR gate 422 is driven low disabling the AND gate 424 and ultimately preventing a dummy load device 436 from being activated. In the event that a 1 0 or a 0 1 is to be written, the exclusive OR gate 422 is activated, activating the AND gate 424, and causing current to be drawn through the dummy load 436 and through one of the generate gates 20d or 20e. This ensures that when only one of the generate gates is enabled that current for both generate gates is being supplied to node 410, a portion of the current will be drawn off through the dummy load 436 to ensure that the proper amount of current is received by the generate gate 20d or 20e.

A domain generate switch 450 comprising a Baker-clamped predriver having an input port 452 connected to the AND gate 428, an output port 454, and a second output port 456 is connected at its output port 454 to a diode 460. The domain generate switch 450 is controlled by the AND gate 428 in response to signals from the data and timing buses. The diode 460 is connected between the domain generate switch 450 and the generate gate 20d. Similarly, the generate gate 20e has a diode 462 connected to it. A domain generate switch 464 is connected to the diode 462. The domain generate switch 464 is a Baker-clamped predriver having an input port 466 connected to the AND gate 426, a first output port 468 connected to the diode 462 and a second output port 470. The domain generate switch 464 is controlled by the AND gate 426 in response to signals from the data and timing buses. The output ports 456 and 470 are connected to a common lead 472 which is connected to a domain generate enable switch 474. The domain generate enable switch 474 is a Baker-clamped predriver having an input port 476, a first output port 478 connected to the lead 472 and a grounded output port 480. An energy storage means comprising a charge storage means 482 has a capacitor 484, and a parallel connected resistor 486. It also is connected to the common lead 472 and the output port 478. The charge storage means is energized from a potential source.

The replicate gates 20f and 20g are connected to a diode 500 which is connected to a domain replicate switch 502 comprising a Baker-clamped predriver having an input port 504 connected to the timing bus 16 to receive timing signals from the controller 12, an output port 506 connected to the diode 500 and a second output port 508. An energy storage means comprising a charge storage means 510 which has a capacitor 512 and a resistor 514 connected in parallel with it, is connected to the output port 508. The charge storage means 510 is energized from a potential source. A domain replicate enable switch 520 comprising a Baker-clamped predriver having an input port 522, an output port 524 and a grounded output port 526 is connected to the charge storage device 510 and the output port 508.

An energy storage means comprising an inductor 530 is connected to the swap gate 20h and to a domain swap switch 532 comprising a Baker-clamped predriver. The swap switch 532 has an input port 534 connected to the timing bus 16 to receive timing signals from the controller 12, an output port 536 connected to the inductor 530 and a grounded output port 538.

The boot replicate gate 20i has a diode 540 connected to it. A boot replicate switch 542 comprising a Baker-clamped predriver having an input port 544 connected to timing bus 16 to receive timing signals from the controller 12, a first output port 546 connected to the diode 540 and a second output port 548. An energy storage means comprising a charge storage means 550 has a capacitor 552 connected in parallel with a resistor 554. The charge storage means 550 is energized from a potential source. A boot replicate enable switch 560 comprising a Baker-clamped predriver has an input port 562 connected to timing bus 16 to receive timing signals from the controller 12 and a first output port 564 connected to the charge storage means 550 and then a grounded and an output port 566.

The boot swap gate 20j has an energy storage means comprising an inductor 570 connected to it, and a boot swap switch 572 is connected to the inductor 570. The boot swap switch 572 comprises a Baker-clamped predriver having an input port 574 connected to the timing bus 16 to receive timing signals from the controller 12, a first output port 576 connected to the inductor 570, and a grounded output port 578.

A dummy load 436 is associated in its operation with the generate gates 20d and 20e. The dummy load 436 is an external impedance connected to a dummy load switch 580 which is a Baker-clamped predriver having an input port 582 connected to the AND gate 424, a first output port 584 connected to the dummy load 436, and a second output port 586 connected to the common lead 472.

Referring now to the plurality of current generators 400, the constant current generator 402 comprises an input NPN bipolar transistor 600 having a base 602 connected to receive a reference voltage $V_R$, a collector 604, and an emitter 606. The base 602 is connected to a voltage reference source supplying a voltage $V_R$. A resistor 608 connects the collector 604 to a voltage supply rail 610. A bias resistor 612 is connected between the supply rail 610 and the emitter 606. A PNP bipolar transistor 614 having a base 616, a collector 618, and an emitter 620 is connected at its base 616 to the junction of the resistor 612 and the emitter 606. The emitter 620 is connected to a resistor 622 which is connected to the supply rail 610. The emitter 618 is connected to the current node 410. The switch 412 is connected through a resistor 624 to the junction of the base 616 and emitter 606. The switch 412 comprises a Baker-clamped predriver having an input port 630 connected to the timing bus 16 to receive timing signals from the controller 12, an output port 632 connected to the resistor 624, and a second output port 634, which is grounded. In operation, the timing signal supplied to the input port 630 is driven high causing the output port 632 and output port 634 to be coupled together, grounding the resistor 624 and allowing current to flow through the transistor 614.

The current source 404 is substantially identical to the current source 402. It comprises an NPN bipolar transistor 640 having a base 642 adapted to be connected to the reference potential $V_R$. The transistor 640 also includes a collector 644 and an emitter 646. The collector 644 is connected to a resistor 648 which is energized by the potential on the supply rail 610. A resistor 650 is connected between the supply rail 610 and the emitter 646. A PNP bipolar transistor 652 having a base 654, a collector 656, and an emitter 658 is connected at its collector 656 to the node 410. The emitter 658 is connected through a resistor 660 to the supply rail 610. The base 654 is connected to be driven by the signals from the resistor 650 and the emitter 646 of the transistor 640. The enabling switch 414 comprises a Baker-clamped predriver having an input port 666 connected to the timing bus 16 to receive timing signals from the controller 12, a first output port 668, and a grounded output port 670. The first output port 668 is connected to a resistor 662 which is connected to a node defined by the emitter 646, the resistor 650 and the base 654. When the input port 666 is driven high by the timing signal from the controller 12, the output ports 668 and 670 are coupled together, pulling the base 654 low and causing the current source 404 to deliver current to the node 410.

The current source 406 comprises an NPN bipolar transistor 700 having a base 702, a collector 704, and an emitter 706. The transistor 700 is adapted to receive the reference voltage $V_R$ at its base 702. A resistor 710 is connected between the collector 704 and the supply rail 610. A resistor 712 is connected from the supply rail 610 to the emitter 706. A PNP bipolar transistor 720 having a base 722, a collector 724, and an emitter 726 is connected at its base 722 to the junction of the emitter 706 and the resistor 712. The collector 724 is connected to the node 410. The emitter 726 is connected through a resistor 728 to the supply rail 610 to receive supply voltage therefrom. The switch 416 comprises a Baker-clamped predriver having an input port 750 connected to the timing bus 16 to receive timing signals from the controller 12, a first output port 752, and a second output or grounded output port 754. A resistor 756 is between the output port 752 and to the junction of the emitter 706 and the resistor 712. The switch 416 controls the enabling or disabling of the current source 406. When the input port 750 is driven high by the timing signal from the controller 12, the resistor 756 is coupled to ground, allowing current to flow in the transistor 720 which is delivered to the node 410. Thus, it is apparent that the constant current sources 402, 404, and 406 may be enabled separately, two at a time, or all three together, to supply varying fixed amounts of current to the node 410.

A photocurrent compensation means 800 comprising a resistor 802 connected to the node 410 also comprising a NPN bipolar transistor 804, having a base 806, a collector 808, and an emitter 810. The base 806 and the emitter 810 are coupled together to bias the transistor off in normal operation. The junction of the base 806 and the emitter 810 is connected to ground. In the event that the transient ionizing radiation tolerant function gate controller 18 is exposed to transient ionizing radiation causing extra currents to begin flowing in the various transistors, the transistor 804 will become conductive. The transistor 804 will draw current from the current node 410 and prevent damage to the function gate controller 18 while limiting change in any currents then flowing in the generate, replicate, or swap gates of the bubble memory 20.

Figure 7:
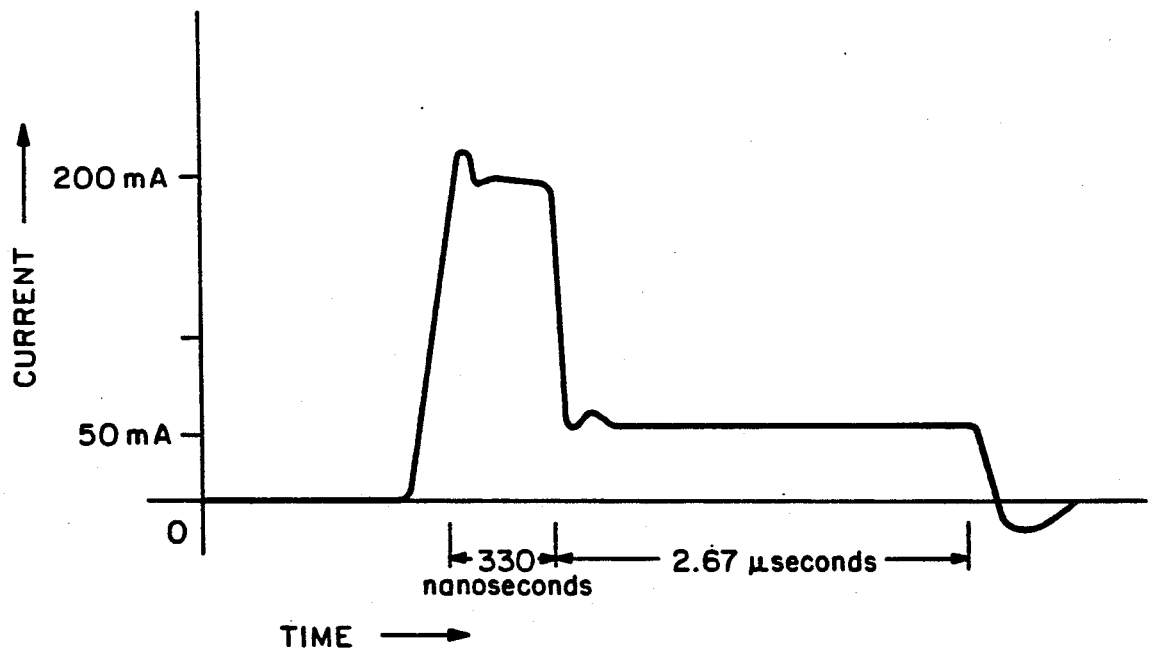
FIG. 7 is a graph of a generate current flowing through the generate gate of the magnetic bubble memory.

In the event that it is desired to perform a magnetic bubble domain generate operation in which two bits are input to be simultaneously stored, the current sources 402 and 404 are enabled by signals from the timing bus 16 to provide current to the node 410. The switch 474 is then enabled, pulling the lead 472 low. If a bit pattern of 11 is to be written, the switch 450 and the switch 464 are enabled, pulling the diodes 460 and 462 low and causing current to flow through the generate gates 20d and 20e. As may best be seen in FIG. 7, a narrow current pulse of 200 milliamperes is delivered to the node 410 for 330 nanoseconds. The current source 402 is then switched off by the switch 412 and a pedestal current of 50 milliamperes from the current source 404 continues to flow through the generate gates for 2.67 microseconds. If a 0 and a 1 are to be written, one of the generate gates 20d and 20e will not be enabled and in order to balance the current, the switch 580 will be switched on, allowing one-half of the current to flow through the dummy load 436.

Figure 6:
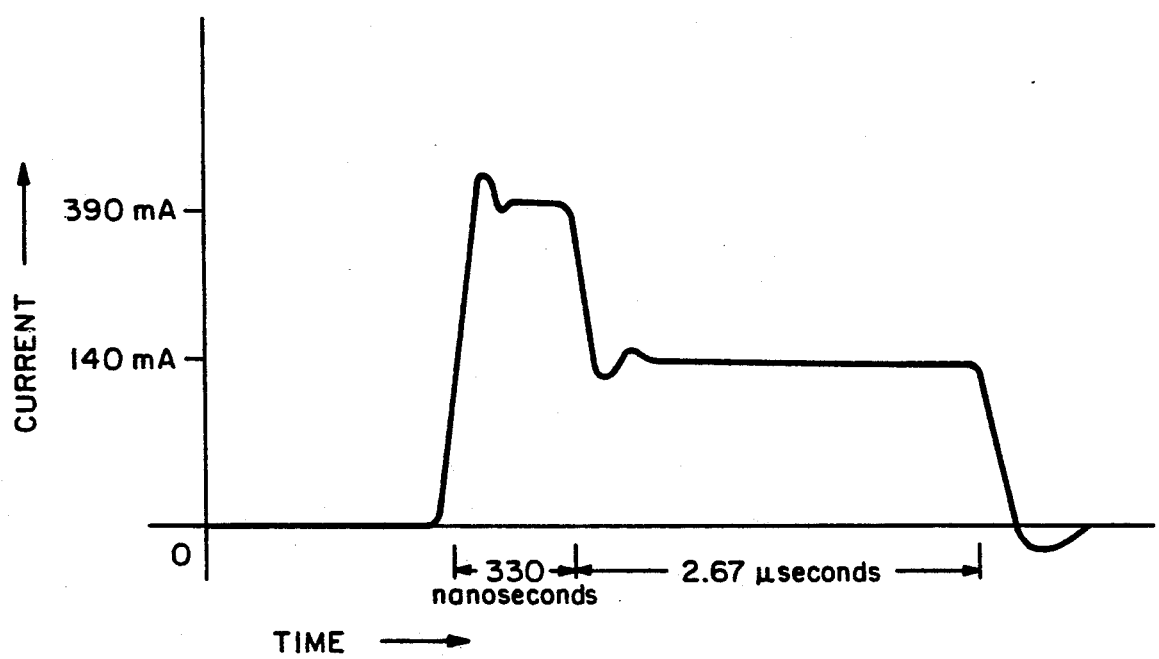
FIG. 6 is a graph of a replicate current flowing through the replicate gate of the magnetic bubble memory.

When it is desired to perform an output operation, a magnetic bubble domain replicate operation is performed wherein a magnetic bubble domain located under the replicate gate 20f or 20g is duplicated for sensing by the sense amplifier. The constant current sources 404 and 406 are enabled, providing current to the node 410. The replicate enable switch 520 is activated, pulling the lead 524 low, followed by the switch 502 being activated, which pulls the diode 500 low, allowing a current pulse of 390 milliamperes to flow through the replicate gates 20f and 20g for 330 nanoseconds, as may best be seen in the graph of FIG. 6. The 390 milliampere current pulse cuts or severs the existing magnetic bubble whose datum is to be output into two magnetic bubbles. After the cut pulse, the current source 406 is shut off and a pedestal current pulse of 140 milliamperes flows for 2.67 microseconds. The pedestal current pulse transfers the newly separated magnetic bubble domain away from the replicate gates 20f and 20g and the magnetic bubble from which it was separated. The switches 414, 502 and 520 are then cutoff, switching off the current flowing through the replicate gates 20f and 20g and completing the replicate operation.

Figure 8:
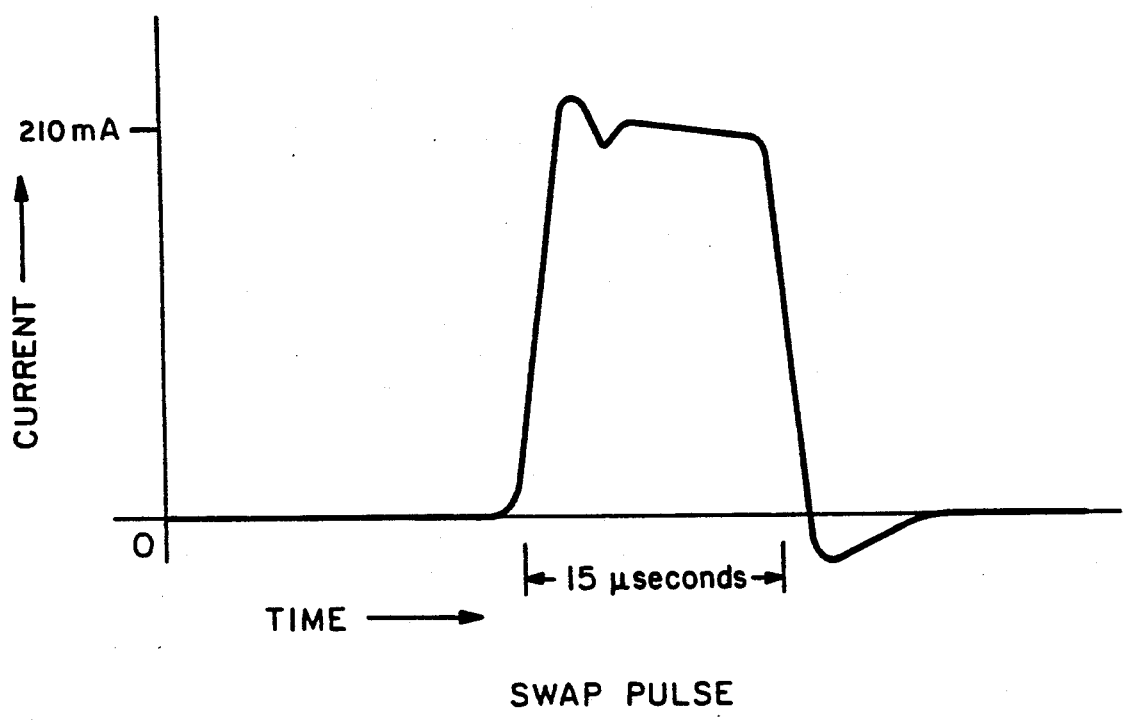
FIG. 8 is a graph of a swap current flowing through the swap gate of the magnetic bubble memory.

When a magnetic bubble domain swap operation transferring magnetic bubbles from the input track of the substrate 20a to a storage loop is performed, the swap switch 532 is activated pulling the port 536 low, allowing a current of 210 milliamperes to flow through the swap gate 20h and through the inductor 530 for a period of 15 microseconds, as may best be seen in the graph of FIG. 8. Thus, it may be appreciated that the currents are steered into the gates by the function switches.

If the magnetic bubble memory system 10 is exposed to transient ionizing radiation causing all of the transistors to switch on and allowing all of the current sources to supply current to the node 410, the enable switches would switch on at the same time as the function switches. For instance, the generate enable switch would switch on at the same time as the generate function switches 450 and 464. However, the charge storage device 482 would hold the output port 478 of the switch 474 temporarily high so that the potential drop across the generate gates 20d and 20e would be essentially zero, thereby preventing current from flowing through them. Similarly, the charge stored on the capacitor 512 would provide essentially zero potential drop across the replicate gates 20f and 20g preventing current from flowing through them. The same would also be true for the boot replicate gate 20i due to the charge stored on the capacitor 552. Thus, despite all of the switches having been switched on, no current would begin flowing through the generate, replicate, or swap gates. The swap gate 20h is connected to the inductor 530 which will prevent any rapid change in the amount of current flowing in the swap load during exposure to a transient ionizing radiation pulse.

However, if while a function is being performed, for instance the replicate operation, the system 10 is exposed to transient ionizing radiation, the replicate gates 20f and 20g will experience an increase in current. The duration of the unwanted current increase or spike will be limited by the switch 502 and the amplitude will be limited by the photocurrent compensation transistor 804. The nonselected gates thus will stay off and the selected gate will remain energized with minimal disruption during and after exposure to the radiation. The generate and replicate gates thus may experience a brief current increase if exposed to the radiation pulse while enabled. The swap gate, even if enabled, will not experience a radiation induced current spike due to the action of its associated inductor While there have been illustrated and described particular embodiments of the present invention, it will be appreciated that numerous changes and modifications will occur to those skilled in the art within the true spirit and scope of the present invention.

What is claimed is:

1. A transient ionizing radiation tolerant peripheral system for use with a magnetic bubble memory system having a substrate in which a plurality of magnetic bubble domains are formed for storage of data, a plurality of function gates positioned on the substrate for generating, replicating and swapping the magnetic bubble domains within the substrate and a pair of rotating field coils wound around the substrate for producing a rotating magnetic field for moving the magnetic bubble domains about the substrate, the transient ionizing radiation tolerant peripheral system comprising:
a transient ionizing radiation tolerant rotating field coil driver connectable to one of the rotating field coils of the magnetic bubble memory for circulating magnetic bubble domains within the substrate during transient ionizing radiation; and
a transient ionizing radiation tolerant function gate controller connectable to one of the function gates for transferring data between the substrate and an external device during transient ionizing radiation.

2. A transient ionizing radiation tolerant peripheral system for use with a magnetic bubble memory as defined in claim 1, wherein the transient ionizing radiation tolerant function gate controller is connectable to the plurality of function gates.

3. A transient ionizing radiation tolerant peripheral system for use with a magnetic bubble memory as defined in claim 1, wherein the transient ionizing radiation tolerant function gate controller comprises means for limiting a change in current through the function gate upon exposure to transient ionizing radiation.

4. A transient ionizing radiation tolerant peripheral system for use with a magnetic bubble memory as defined in claim 3, wherein the means for limiting a change in current comprises means for storing charge.

5. A transient ionizing radiation tolerant peripheral system for use with a magnetic bubble memory as defined in claim 3, wherein the means for limiting a change in current through the function gate comprises an inductor.

6. A transient ionizing radiation tolerant peripheral system for use with a magnetic bubble memory as defined in claim 1, wherein the function gate controller further comprises a plurality of constant current sources for supplying selected levels of current to the function gate.

7. A transient ionizing radiation tolerant peripheral system for use with a magnetic bubble memory as defined in claim 1, wherein the transient ionizing radiation tolerant function gate controller includes an energy storage device connectable to the function gate for limiting a change in a current through the function gate when the transient ionizing radiation tolerant function gate controller is exposed to transient ionizing radiation.

8. A transient ionizing radiation tolerant peripheral system for use with a magnetic bubble memory as defined in claim 1, wherein the transient ionizing radiation tolerant function gate controller comprises a plurality of constant current sources connectable to a first end of the function gate and a capacitance connectable to a second end of the function gate opposite the constant current sources for limiting a change in a current through the function gate when it is exposed to transient ionizing radiation.

9. A transient ionizing radiation tolerant peripheral system for use with a magnetic bubble memory as defined in claim 1, wherein the transient ionizing radiation tolerant field coil driver comprises: a transistor having a control electrode and a pair of main electrodes; and a photocurrent shunt connected with the control electrode and to one of the main electrodes of the transistor.

10. A transient ionizing radiation tolerant peripheral system for use with a magnetic bubble memory as defined in claim 1, wherein the transient ionizing radiation tolerant function gate controller comprises: a transistor having a control electrode and a pair of main electrodes for controlling a flow of current to the function gate; and a photocurrent shunt connected to the control electrode and one of the main electrodes for selectively shunting current away from the function gate when the function gate is exposed to transient ionizing radiation.

11. A transient ionizing radiation tolerant peripheral system for use with a magnetic bubble memory as defined in claim 1, wherein the transient ionizing radiation tolerant rotating field coil driver comprises: a first transistor; and means coupled to the transistor for reducing a quantity of charge stored in the transistor.

12. A transient ionizing radiation tolerant peripheral system for use with a magnetic bubble memory as defined in claim 11, wherein the means for reducing charge storage comprises a Schottky diode connected from a base to a collector of the transistor.

13. A transient ionizing radiation tolerant peripheral system for use with a magnetic bubble memory as defined in claim 11, wherein the means for reducing charge storage comprises a Baker clamp connected from a base of the transistor to a collector of the transistor.

14. A transient ionizing radiation tolerant peripheral system for use with a magnetic bubble memory as defined in claim 11, wherein the means for reducing charge storage comprises a second transistor connected from a base of the first transistor to an emitter of the first transistor.

15. A transient ionizing radiation tolerant peripheral system for use with a magnetic bubble memory as defined in claim 14, wherein the means for reducing charge storage comprises a Baker clamp connected from the base to a collector of the first transistor.

16. A transient ionizing radiation tolerant peripheral system for use with a magnetic bubble memory as defined in claim 11, wherein the means for reducing charge storage comprises a resistor connected from a base of the transistor to an emitter of the transistor.

17. A transient ionizing radiation tolerant peripheral system for use with a magnetic bubble memory as defined in claim 1, wherein the transient ionizing radiation tolerant rotating field coil driver comprises a first switch connected to the field coil and a second switch connected to the field coil and to the first switch, the first and the second switches both conducting when exposed to transient ionizing radiation so that a current due to the transient ionizing radiation is shunted away from the field coil.

18. A circuit for energizing a rotating field coil of a magnetic bubble memory, comprising:
 first current control means for controlling a flow of current through a rotating field coil of a magnetic bubble memory;
 means for shunting photocurrent coupled to said first current control means for reducing a quantity of charge stored in said first current control means;
 second current control means, connected in series with the first current control means for controlling the flow of current through the rotating field coil, the second current control means being conducting when the first current control means is nonconducting;
 means for shunting photocurrent coupled to said second current control means for reducing a quantity of charge stored in said second current control means;
 a first current path through first current control means connected to the rotating field coil for conducting current passing through the rotating field coil when the first current control means is conducting; and
 a second current path through second current control means connected to the rotating field coil and for conducting current passing through the rotating field coil when the second current control means is conducting.

19. A circuit for performing replicate, generate, and swap operations on a magnetic bubble memory, comprising:
 a plurality of constant current generators;
 a semiconductor current source switch connected to each of the constant current generators for controlling current output from the constant current generators;
 a current node connected to the constant current generators to receive current, the current node being connectable to a magnetic domain generate gate of the magnetic bubble memory, to a magnetic domain replicate gate of the magnetic bubble memory and to a magnetic domain swap gate of the magnetic bubble memory;
 a domain generate switch connectable to the magnetic domain generate gate, the domain generate switch comprising a semiconductor;
 a domain replicate switch connectable to the magnetic domain replicate gate, the domain replicate switch comprising a semiconductor;
 a domain swap switch connectable to the magnetic domain swap gate, the domain swap switch comprising a semiconductor;
 a plurality of enabling switches each being connected respectively to the domain generate switch, the domain replicate switch and the domain swap switch, each of the enabling switches also being connected to ground; and
 a source of electric charge connected to one of the semiconductor current source switches and to one of the enabling switches for maintaining an elevated potential at one of the semiconductor current source switches when the semiconductor current source switches are exposed to transient ionizing radiation allowing replicate, generate, and swap operations during the transient ionizing radiation.

20. A circuit for performing replicate, generate, and swap operations on a magnetic bubble memory as defined in claim 19, further comprising an inductor connected to the magnetic domain swap gate to limit a change in current through the magnetic domain sweep gate due to transient ionizing radiation.

* * * * *

UNITED STATES PATENT AND TRADEMARK OFFICE
CERTIFICATE OF CORRECTION

PATENT NO. :   5,107,458
DATED      :   April 21, 1992
INVENTOR(S):   Friedman, A.

It is certified that error appears in the above-identified patent and that said Letters Patent is hereby corrected as shown below:

ON THE FACE:

In the Abstract at line 2, delete "a" [second occurrence].

In the Abstract, line 13, change "carries" to --carriers--.

At column 4, line 39, after "flow" insert --to--.

At column 5, line 28, delete "the" [second occurrence].

At column 5, line 53, after ";" delete the period.

At column 8, line 51, after "coils" insert a period.

At column 12, line 68, delete "rotating" [second occurrence].

At column 15, line 51, delete "to".

At column 15, line 63, change "comprising" to --comprises--.

UNITED STATES PATENT AND TRADEMARK OFFICE
CERTIFICATE OF CORRECTION

PATENT NO. :   5,107,458

DATED      :   April 21, 1992

INVENTOR(S) :  Friedman, A.

It is certified that error appears in the above-identified patent and that said Letters Patent is hereby corrected as shown below:

IN THE CLAIMS:

At column 20, line 49, change "sweep" to --swap--.

Signed and Sealed this

Tenth Day of August, 1993

Attest:

MICHAEL K. KIRK

*Attesting Officer*   *Acting Commissioner of Patents and Trademarks*